United States Patent [19]

Fukaishi et al.

[11] Patent Number: 5,442,227
[45] Date of Patent: Aug. 15, 1995

[54] FIELD EFFECT TRANSISTOR HAVING A LOW THRESHOLD VOLTAGE SHIFT

[75] Inventors: Muneo Fukaishi; Hikaru Hida, both of Tokyo, Japan

[73] Assignee: NEC Corporation, Tokyo, Japan

[21] Appl. No.: 180,058

[22] Filed: Jan. 11, 1994

[30] Foreign Application Priority Data

Jan. 14, 1993 [JP] Japan ................................. 5-005212

[51] Int. Cl.[6] ........................................ H01L 29/04
[52] U.S. Cl. ........................ 257/628; 257/420; 257/255
[58] Field of Search .................. 257/416–420, 257/627, 628, 254, 255

[56] References Cited

U.S. PATENT DOCUMENTS

| 4,423,434 | 12/1983 | Komatsu | 257/627 |
| 4,758,896 | 7/1988 | Ito | 257/67 |
| 4,791,471 | 12/1988 | Onodera et al. | 257/420 |
| 4,980,750 | 12/1990 | Ueno | 257/420 |

FOREIGN PATENT DOCUMENTS 61-88567  5/1986  Japan .

OTHER PUBLICATIONS

"Piezoelectric Effects in GaAs FET's and Their Role in Orientation-Dependent Device Characteristics", *IEEE Transactions on Electron Devices*, vol. ED-31, No. 10, Oct. 1984 by Peter M. Asbeck et al. pp. 1377–1380.
"Theoretical Study of the Piezoelectric Effect on GaAs MESFET's on (100), (011), and (111)Ga, and (111) As Substrates", *IEEE Transactions on Electron Devices*, vol. 36, No. 9, Sep. 1989, T. Onodera et al. pp. 1580–1585.
"Experimental Study of the Orientation Effect of GaAs MESFET's Fabricated on (100), (011), and (111)Ga, and (111) As Substrates", *IEEE Transactions on Electron Devices*, vol. 36, No. 9, Sep. 1989, T. Onodera et al. pp. 1586–1590.

*Primary Examiner*—Robert P. Limanek
*Assistant Examiner*—Alexander Oscar Williams
*Attorney, Agent, or Firm*—Young & Thompson

[57] ABSTRACT

The main surface of a semiconductor substrate, on which a field effect transistor is formed, coincides with the (nm0) lattice plane of the substrate and drain electrode thereof is oriented to flow drain current in a direction parallel to the [$\overline{mn}$0] or [$\overline{mn}$0] axis, wherein n and m independently represent an arbitrary integer, provided that n and m are not 0 at the same time, and that the quotient n/m (m is not zero) is not an integer. Accordingly, the plane orientation of the substrate and the direction of the drain current have a relationship such that no piezoelectric charges are induced in the channel region of the field effect transistor. Therefore, substantially no piezoelectric charges are generated even when a stress is produced in the dielectric layer formed on the substrate. Moreover, deterioration and variation in the electric characteristics due to the variation in the thickness of the dielectric layer are minimized.

4 Claims, 3 Drawing Sheets

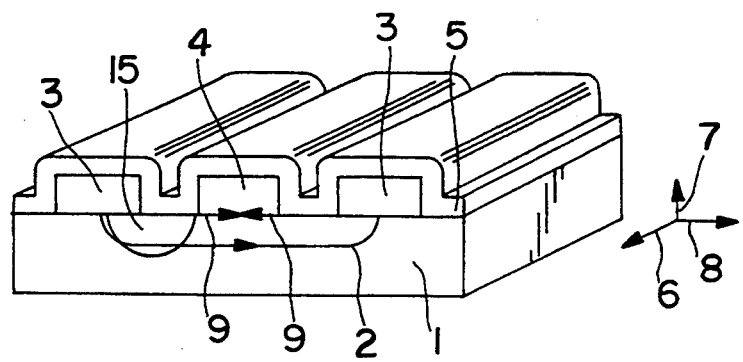
FIG. IA
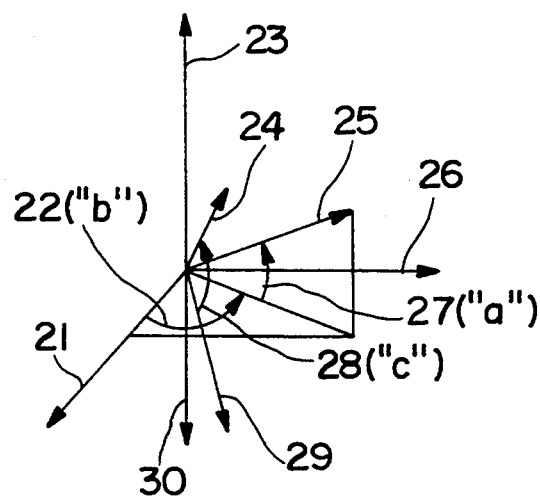
FIG. IB
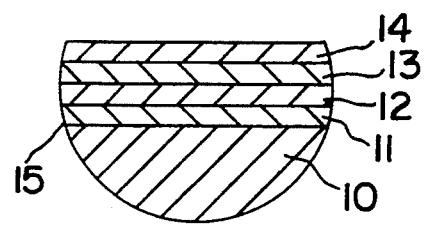
FIG. IC

FIELD EFFECT TRANSISTOR HAVING A LOW THRESHOLD VOLTAGE SHIFT

BACKGROUND OF THE INVENTION (a) Field of the Invention

The present invention relates to a semiconductor device, and more particularly, to a semiconductor device having a field effect transistor formed on a semiconductor substrate having a piezoelectric property.

(b) Description of the Related Art

Active research has been conducted pursuing high-speed and low power LSI's which employ field effect transistors made of a III-V group compound semiconductor such as GaAs. For the development of such LSI's, a higher level of integration is required as well as miniaturization of device elements. Further, uniformity in the characteristics of device elements contained in the integrated circuits must be improved.

Conventionally, field effect transistors of the type described above are formed on a wafer so that the main surface of the wafer coincides with the (100) lattice plane of the wafer, and that drain current flows in the [01$\bar{1}$] direction, in view that the wafer is easily cleaved when chips are cut out therefrom.

However, as described in IEEE Transactions on Electron Devices, Vol. ED-31, No. 10, October, 1984, P. M. Asbeck et al., it has been known that the threshold voltage of a conventional field effect transistor varies in a case in which the field effect transistor is formed on a substrate having a piezoelectric property, such as a GaAs substrate. This is because a piezoelectric effect is induced in the substrate of the semiconductor device due to stresses in a passivation layer or an interlayer dielectric layer so that a piezoelectric charge is generated in the channel region of the field effect transistor.

In the conventional semiconductor device having field effect transistors of the type as described above, a stress generated in the dielectric layer acts to induce a piezoelectric effect in the substrate having a piezoelectric property. In other words, the gate of the field effect transistor is oriented in such a direction that piezoelectric charges are induced due to the stress. As a result, the threshold voltage shifts due to the piezoelectric charges generated in the channel region, so that the circuit may be unable to operate in a predetermined function. In addition, since a stress in the dielectric layer changes depending on the thickness of the dielectric layer, the variation of the thickness of the dielectric layer in the wafer affects the distribution of the piezoelectric charges generated in the wafer, resulting in a shift in the threshold voltage of the field effect transistor.

In an attempt to minimize a threshold voltage shift in the field effect transistor attributed to the piezoelectric effect in the dielectric layer, which is induced when the field effect transistor is formed on a GaAs substrate, Japanese Patent Laid-open Publication No. 61(1987)-88567 discloses a field effect transistor formed on a main surface of a wafer so that the plane orientation of the main surface coincides with the (N10) lattice plane of the semiconductor substrate and the direction of the drain current is parallel to the [1$\bar{N}$0] crystal axis of the semiconductor substrate. There are no reports, however, which teach field effect transistors in which the plane orientation of the main surface of a wafer is made to coincide with a lattice plane other than the (N10) lattice plane and the gate electrode is oriented in a direction so that the drain current flows in a direction parallel to a crystal axis other than the [1$\bar{N}$0] axis of the substrate. It is still important to enhance the flexibility in designing a semiconductor device having field effect transistors.

SUMMARY OF THE INVENTION

In view of foregoing, it is an object of the present invention to provide a semiconductor device having an improved field effect transistor in which piezoelectric charge due to a stress in a dielectric layer is not substantially generated in a channel region, namely, an improved field effect transistor in which the threshold voltage of a field effect transistor does not substantially shift regardless of a stress in the dielectric layer thereof.

According to the present invention, there is provided a semiconductor device comprising a semiconductor substrate having a main surface of a piezoelectric property and a field effect transistor formed on the main surface of the semiconductor substrate, wherein the main surface of the semiconductor substrate is positioned on a lattice plane of the semiconductor substrate and the direction of the drain current of the field effect transistor is parallel to a crystal axis of the semiconductor substrate, the combination of the indexes of the lattice plane and the crystal axis being selected from the group consisting of combinations (nm0) and [$\bar{mn}$0] or [$\bar{mn}$0], ($\bar{nm}$0) and [$\bar{mn}$0] or [$\bar{mn}$0], ($\bar{nm}$0) and [$\bar{mn}$0] or [$\bar{mn}$0], and ($\bar{nm}$0) and [$\bar{mn}$0] or [$\bar{mn}$0], wherein n and m independently represent an arbitrary positive integer, respectively, and $\bar{n}$ and $\bar{m}$ represent a negative integer having an absolute value equal to the absolute values of n and m, respectively, provided that n and m are not 0 at the same time, and that the quotient n/m is not an integer when m is not zero.

With the semiconductor device having a field effect transistor in which the plane orientation of the semiconductor substrate (wafer) and the direction of drain current are set to have the above-mentioned relationship, a piezoelectric charge is not substantially induced regardless of the stress generated in the dielectric layer. Accordingly, a shift in the threshold voltage due to a stress in the dielectric layer is not substantially produced.

BRIEF DESCRIPTION OF THE DRAWINGS

The above and further objects, features and advantages of the present invention will be more apparent from the following description, referring to the accompanying drawings in which:

FIG. 1A is a schematic perspective view showing the main surface and a cross-section of a semiconductor device having a field effect transistor according to an embodiment of the present invention;

FIG. 1B is a chart showing the relationship between the plane orientation of a wafer and the direction of drain current in the field effect transistor of FIG. 1A;

FIG. 1C is an enlarged perspective view showing the cross section of substrate 1 of the present invention;

DETAILED DESCRIPTION OF THE PREFERRED EMBODIMENTS

Figure 2:
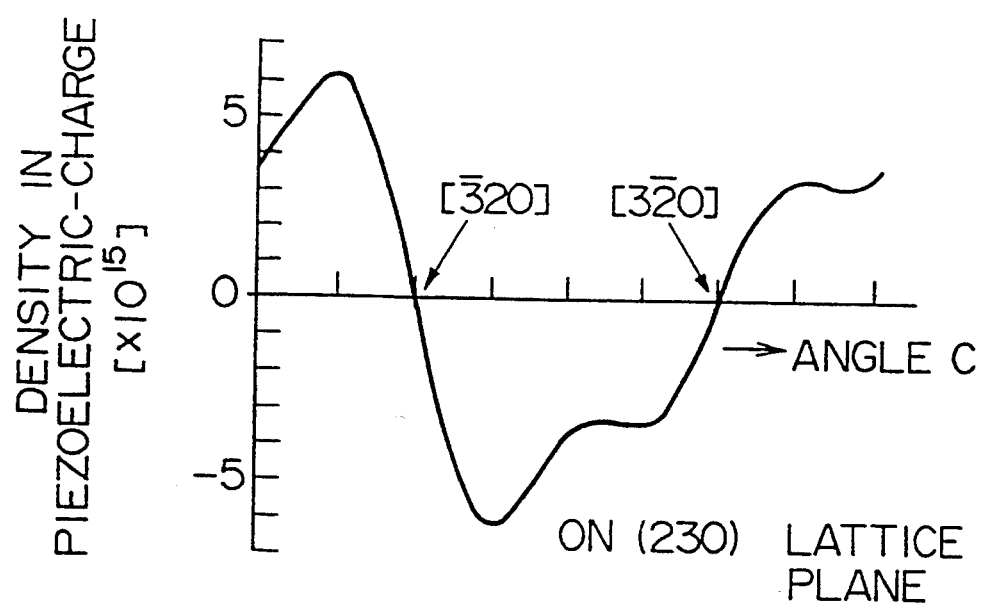
FIG. 2 is a diagram showing variation in piezoelectric charge density vs crystal axis as a parameter in the embodiment of FIG. 1A, in which the plane orientation of the main surface of the wafer is selected to coincide with the (230) lattice plane of the substrate.

Before describing the embodiment of the present invention, the principle of the present invention will be described first. A field effect transistor according to the principle of the present invention is shown in FIG. 1A, in which the plane orientation of a wafer is indicated by a numeral 7 and the direction of drain current is indicated by a numeral 8. In the field effect transistor of FIG. 1A, a stress 9 acts in a boundary plane between a gate electrode 4 and a dielectric layer 5 in a direction perpendicular to the direction 6 in which the gate electrode 4 is extended, namely, in a direction 8 parallel to the direction of drain current 2.

FIG. 1B illustrates the relationship between the plane orientation of the wafer and the direction of the drain current of FIG. 1A, in which the angle 27 between a plane orientation vector 25 indicating the plane orientation of the wafer and the (001) lattice plane is indicated by an arrow showing that the direction toward the [001] axis 23 is defined as the positive direction, the value of the angle 27 being expressed as "a" between the parentheses in FIG. 1B. The angle 22 between the projection vector of the plane orientation vector 25 projected on the (001) plane and the (010) lattice plane is indicated by an arrow showing that the direction toward the [010] axis 26 as viewed from the origin of the coordinate axes is defined as the positive direction, the value of the angle 22 being expressed as "b" between parentheses in FIG. 1B. The angle 28 between a vector 24 indicating the direction of the drain current and the projection axis 29 of the [00$\bar{1}$] axis 30 projected on the (230) plane is indicated by an arrow showing that the counterclockwise direction as illustrated in FIG. 1B by the arrow is defined as the positive direction, the value of the angle 28 being expressed as "c" between the parentheses in FIG. 1B.

In case that the substrate of the field effect transistor has point group $\bar{4}$3m, the piezoelectric coefficient contributing to the generation of piezoelectric charge becomes zero, and therefore no piezoelectric charge is generated, provided that the value of the angles as described above defining the plane orientation and the gate orientation of the field effect transistor are determined to satisfy the following two equations:

$\sin (a) = 0$ and $\cos (c) = 0$.

Namely, the field effect transistor is formed such that the plane orientation of the main surface coincides with the plane orientation 7 of the (nm0) lattice plane (or ($\overline{nm}$0) lattice plane when negative plane indexes of a lattice plane are to be selected) of the semiconductor substrate (wafer) 1, and the direction 8 of drain current 2 is parallel to the [m$\bar{n}$0] axis or [$\overline{mn}$0] axis. Although the orientation of the main surface coinciding with the (n10) lattice plane is already known, other orientation of the main surface coinciding with the (nm0) lattice plane are not taught by the Patent Publication as described before.

FIG. 1C is an enlarged perspective diagram showing details of substrate 1.

FIG. 2 is a diagram showing a variation in the density of piezoelectric charges in an embodiment of the present invention, in which the plane orientation of the main surface of the wafer is selected to coincide with the (230) lattice plane. In FIG. 2, the axis of abscissa indicates the angle "c" (angle 28 in FIG. 1B) between the vector 24 indicating the direction of the drain current and the axis 29 (in this case, the [00$\bar{1}$] axis 30) indicating the projection of the [00$\bar{1}$] axis 30 on the (230) plane, while the axis of ordinate indicates piezoelectric charge generated at a position which is offset by 0.3 μm in the direction of the drain from the center of the gate and is located at a depth of 1.0 μm from the surface of the substrate.

Values of the density of the piezoelectric charge were obtained by a simulation under the condition in which the length of the gate is 1.0 μm, the stress in the dielectric layer is $1 \times 10^{10}$ dyn/cm$^2$, and the thickness of the dielectric layer is 1.0 μm. As shown in FIG. 2, no piezoelectric charge is generated when the angle 28 between the vector 24 indicating the direction of the drain current and the [00$\bar{1}$] axis 30 becomes 90° or 270°, which correspond to the directions of the drain current [$\bar{3}$20] and [3$\bar{2}$0], respectively.

Accordingly, in the case in which the semiconductor device is formed such that the plane orientation of the main surface coincides with the plane orientation 7 of the (nm0) lattice plane of the wafer 1, and the direction 8 of drain current 2 is parallel to the [m$\bar{n}$0] axis or [$\overline{mn}$0] axis, wherein n and m are arbitrary positive integers, the piezoelectric coefficient contributing to the generation of piezoelectric charge becomes zero, in other words, no piezoelectric charge is generated. Thus, the threshold voltage does not shift regardless of a stress in the dielectric layer.

Figure 3:
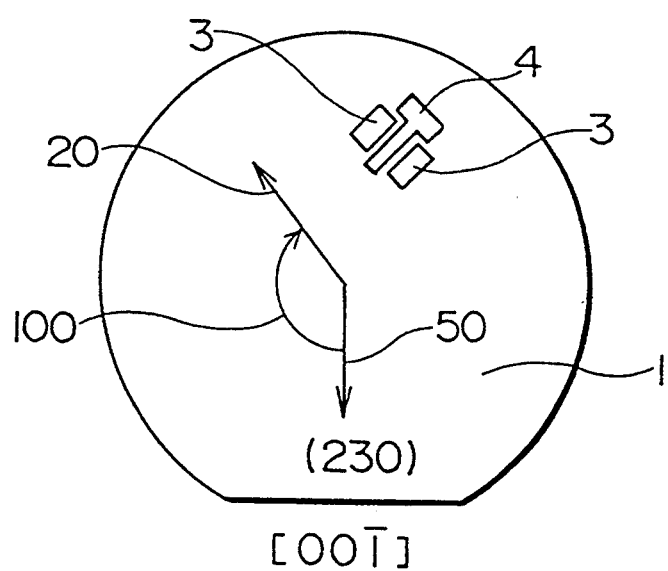
FIG. 3 is a schematic plan view of the wafer of the semiconductor device of FIGS. 1A and 2 and FIG. 4 is a diagram demonstrating the effect of the present invention in the embodiment shown in FIGS. 1A and 2.

FIG. 3 is a schematic plan view showing the wafer of the field effect transistor of FIG. 1A. As shown in FIG. 3, the semiconductor substrate 1 having a piezoelectric property is prepared such that the crystal plane (230) of the substrate 1 is selected at the main surface, on which a field effect transistor has a gate electrode 4 and ohmic electrodes 3 for source and drain regions. The axis 29 shown in FIG. 1B, which is the projection of the [00$\bar{1}$] axis 30 on the (230) plane, corresponds to the [00$\bar{1}$] axis 50 shown in FIG. 3. A numeral 100 indicates the angle between the direction 20 of drain current of the field effect transistor and the [00$\bar{1}$] axis 50.

Back to FIGS. 1A and 1C, there is shown, a semi-circle 15 in FIG. 1A, which is enlarged in FIG. 1C showing detail of the cross-section of the substrate 1, laminated layers formed in the semiconductor substrate 1. In FIG. 1C, a numeral 10 denotes a semiconductive GaAs substrate in which the (230) lattice plane thereof is selected at the main surface, a numeral 11 denotes an undoped GaAs layer having a thickness of about 500 nm, a numeral 12 denotes an undoped InGaAs layer having a thickness of about 15 nm, a numeral 13 denotes an n-type GaAs layer having a thickness of about 20 nm and having an impurity concentration of about $3 \times 10^{18}$ cm$^{-3}$, and a numeral 14 denotes an undoped AlGaAs layer having a thickness of about 3 nm. These layers are formed by an MBE (molecular beam epitaxy) method on the semiconductor substrate. In FIG. 1A, the gate electrode 4 is then formed by sputterring, the ohmic electrode 3 is formed by vacuum evaporation, and the dielectric layer 5 such as an SiO$_2$ layer is formed by a CVD method as a passivation layer. In this embodiment, WSi is used as a material for the gate electrode 4, AuGe/Ni/Au are used as materials for the ohmic electrode 3, and SiO2 is used as a material for the passivation layer 5.

Figure 4:
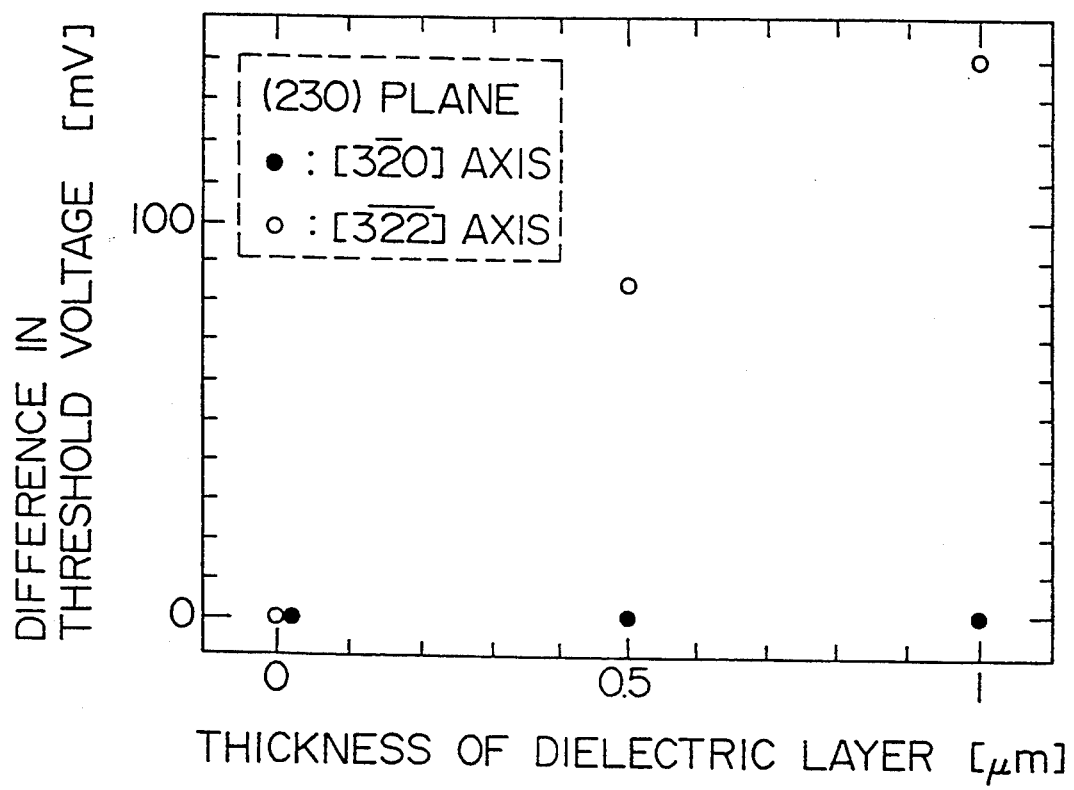

To measure a threshold voltage shift due to a stress in the dielectric layer 5, a field effect transistor having the above-described structure is formed on a semiconductor substrate having a piezoelectric property. The electric characteristics of the field effect transistor are measured while the passivation layer 5 is gradually etched by BHF (buffered hydrofluoric) acid. FIG. 4 is a diagram thus obtained, which demonstrates the effect of the present invention in the embodiment as shown in FIGS. 1A and 2. In FIG. 4, the axis of abscissa indicates the thickness of the dielectric layer, while the axis of ordinate indicates the difference between a measured threshold voltage and the threshold voltage at the time when the thickness of the dielectric layer is zero, namely, when the dielectric layer is not formed.

As is apparent from FIG. 4, with the field effect transistor in which the (230) lattice plane is selected at the main surface, substantially any threshold voltage shift was not observed when the direction of the drain current was parallel to the $[3\bar{2}0]$ axis, whereas threshold voltage was observed to shift depending on the thickness of the dielectric layer if the direction of the drain current was parallel to the $[3\bar{2}\bar{2}]$ axis.

Although a GaAs substrate is used in the above embodiment, a similar effect can be achieved even in the case in which other semiconductive materials such as InP, InAlAs, GaSb, InSb, and GaInP are used, or in the case in which other doping methods such as δ-doping or channel-doping are used. In addition, it will be understood that a similar effect can be obtained in a doping region and for a stress caused by other dielectric materials such as SiN and AlN.

Further, although the above description is given for the case in which indexes of the lattice plane are positive integers, the present invention is not limited to such a case. Namely, when n and m are arbitrary positive or negative integers, the main surface of the semiconductor substrate on which a field effect transistor is formed is positioned on the (nm0) lattice plane, and the direction of drain current is selected in parallel to the $[\bar{m}n0]$ or $[m\bar{n}0]$ axis of the semiconductor substrate for applying the present invention, provided that $\bar{n}$ and $\bar{m}$ represent a negative or positive integer depending on a condition that n and m represent a positive or negative integer, respectively, $\bar{n}$ and $\bar{m}$ having an absolute value equal to the absolute values of n and m, respectively. In such a case, it is required that the conditions where n and m are not 0 at the same time and the quotient n/m (m is not zero) is not an integer be met. Moreover, the present invention covers such a case in which one of two indexes n and m is positive and the other of the two is negative.

Since above embodiments are described only for examples, the present invention is not limited to such embodiments and it will be obvious for those skilled in the art that various modifications or alterations can be easily made based on the above embodiments under the scope of the present invention.

What is claimed is:

1. A semiconductor device comprising a semiconductor substrate having a main surface having a piezoelectric property and a field effect transistor formed on the main surface of said semiconductor substrate, wherein the main surface of said semiconductor substrate is positioned on a lattice plane of said semiconductor substrate and said field effect transistor has a drain current flowing in a direction parallel to a crystal axis of said semiconductor substrate, a combination of an index of said lattice plane and an index of said crystal axis being selected from the group consisting of combinations (nm0) and $[m\bar{n}0]$ or $[\bar{m}n0]$, $(\bar{n}m0)$ and $[mn0]$ or $[\bar{m}\bar{n}0]$, $(\bar{n}\bar{m}0)$ and $[mn0]$ or $[\bar{m}\bar{n}0]$, and $(n\bar{m}0)$ and $[\bar{m}n0]$ or $[mn0]$, wherein n and m independently represent an arbitrary positive integer, respectively, and $\bar{n}$ and $\bar{m}$ represent negative integers having an absolute value equal to the absolute values of n and m, respectively, and wherein the quotient n/m is not an integer.

2. The semiconductor device as defined in claim 1, wherein n is equal to 2 and m is equal to 3.

3. A semiconductor device comprising a semiconductor substrate having a main surface of a piezoelectric property and a field effect transistor formed on the main surface of said semiconductor substrate, the main surface of said semiconductor substrate being positioned on the (nm0) lattice plane of said semiconductor substrate, said field effect transistor having a drain current flowing in a direction parallel to one of $[\bar{m}n0]$ and $[m\bar{n}0]$ crystal axes of said semiconductor substrate, wherein n and m independently represent an arbitrary positive or negative integer, respectively, and $\bar{n}$ and $\bar{m}$ represent an integer, respectively, having a sign opposite to the signs of n and m and having an absolute value equal to the absolute values of n and m, respectively, and wherein the quotient n/m is not an integer.

4. The semiconductor device as defined in claim 3, wherein n is equal to 2 and m is equal to 3.

* * * * *